United States Patent
Sano et al.

(10) Patent No.: US 7,157,800 B2
(45) Date of Patent: Jan. 2, 2007

(54) BONDED STRUCTURE USING CONDUCTIVE ADHESIVES, AND A MANUFACTURING METHOD THEREOF

(75) Inventors: Takeshi Sano, Kanagawa (JP);
Yoshihiro Yoshida, Kanagawa (JP);
Hideaki Ohkura, Kanagawa (JP);
Hirofumi Kobayashi, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 117 days.

(21) Appl. No.: 10/936,503

(22) Filed: Sep. 9, 2004

(65) Prior Publication Data
US 2005/0062168 A1   Mar. 24, 2005

(30) Foreign Application Priority Data
Sep. 18, 2003   (JP)   ............................ 2003-326877

(51) Int. Cl.
*H01L 23/48*   (2006.01)
(52) U.S. Cl. ........................................ 257/783
(58) Field of Classification Search ........... 257/783
See application file for complete search history.

(56) References Cited

U.S. PATENT DOCUMENTS

| | | | |
|---|---|---|---|
| 5,164,632 A | 11/1992 | Yoshida et al. | |
| 5,262,226 A | 11/1993 | Yoshida | |
| 5,315,206 A | 5/1994 | Yoshida | |
| 5,616,206 A | 4/1997 | Sakatsu et al. | |
| 6,063,701 A | 5/2000 | Kuwazaki et al. | |
| 6,243,147 B1 | 6/2001 | Sano | |
| 6,247,640 B1 | 6/2001 | Kuwazaki et al. | |
| 6,297,564 B1 * | 10/2001 | Chung | ........................ 257/783 |
| 6,472,247 B1 | 10/2002 | Andoh et al. | |
| 6,663,799 B1 * | 12/2003 | Kokubo et al. | ............. 252/512 |

FOREIGN PATENT DOCUMENTS

JP   2002-271005   9/2002

\* cited by examiner

*Primary Examiner*—Lex H. Malsawma
(74) *Attorney, Agent, or Firm*—Oblon, Spivak, McClelland, Maier & Neustadt, P.C.

(57) ABSTRACT

A disclosed bonded structure includes a first electric structure having a first electrode, a second electric structure having a second electrode, and a middle section for electrically and mechanically bonding the first electrode and the second electrode. The middle section consists of conductive adhesives, wherein fusion bonding of metal particles is provided to at least one of the first electrode and the second electrode. The metal particles are capable of fusion bonding at a temperature lower than a thermal hardening temperature of the conductive adhesives. The conductive adhesives contain conductive filler pieces that have a particle size at which fusion bonding does not take place at a temperature lower than the thermal hardening temperature of the conductive adhesives.

18 Claims, 5 Drawing Sheets

BONDED STRUCTURE USING CONDUCTIVE ADHESIVES, AND A MANUFACTURING METHOD THEREOF

BACKGROUND OF THE INVENTION

1. Field of the Invention

The present invention generally relates to a bonded structure using conductive adhesives, and a manufacturing method thereof, and especially relates to solder-free mounting of electronic parts, particularly electronic parts mounting using conductive adhesives, and a method thereof.

2. Description of the Related Art

In electronic device mounting, a bonding technology using conductive adhesives is drawing attention, since the bonding technology can be used at a temperature lower than required by soldering. Further, since the conductive adhesives provide a higher stress relief function than soldering, it is expected that resilience against thermal distortion will be high. Nevertheless, since the conductive adhesives provide lower bonding strength, there is a problem that damage, such as boundary exfoliation, occurs.

A solution has been proposed for bonding two electric structures, each having an electrode. The proposed solution provides an electrode bonding section A that is bonded to the electrode of one of the two electric structures, another electrode bonding section A that is bonded to the electrode of the other electric structure, and a middle section B that is provided between the two electrode bonding sections A, wherein each section A is made to be "hard bonded", and the section B is made to be "soft bonded" in order to improve the bonding strength.

According to a technology disclosed by JPA 2002-271005, the "hard bonding" of the section A is realized by "alloying" (fusing) the electrode and conductive filler pieces, and the "soft bonding" of the section B is realized by employing "conductive adhesives containing conductive particles (conductive filler pieces)". However, for "alloying" (fusing) the conductive filler pieces (conductive particles) having an oxidized film, a special process that includes ultrasonic vibration, pressurization, and heating is necessary. Since a high temperature is used in the heating process, there is a problem that the electric structures to be bonded, such as an electronic device and a substrate, are damaged.

[Patent Reference 1]
JPA 2002-271005

SUMMARY OF THE INVENTION

It is a general object of the present invention to provide "hard bonding" and a method thereof that substantially obviate one or more of the problems caused by the limitations and disadvantages of the related art.

Specifically, the present invention aims at offering a bonded structure, and a manufacturing method thereof, the bonded structure being constituted by two electric structures that are bonded by conductive adhesives, wherein an electrode of each of the electric structures is "hard bonded" by fusion of metal particles at the boundary of an electrode bonding section by a thermosetting process for thermally hardening the conductive adhesives without a special process that includes ultrasonic vibration, pressurization, and high-temperature heating.

Features and advantages of the present invention are set forth in the description that follows, and in part will become apparent from the description and the accompanying drawings, or may be learned by practice of the invention according to the teachings provided in the description. Objects as well as other features and advantages of the present invention will be realized and attained by "hard bonding" and a method thereof particularly pointed out in the specification in such full, clear, concise, and exact terms as to enable a person having ordinary skill in the art to practice the invention.

To achieve these and other advantages and in accordance with the purpose of the invention, as embodied and broadly described herein, the invention provides as follows.

[Means for Solving the Problem]

The present invention provides, among other things, a bonded structure wherein a first electric structure and a second electric structure are bonded by conductive adhesives, wherein a fusion bond phenomenon of metal particles is employed, the fusion bond phenomenon taking place at a temperature lower than a thermal hardening temperature of the conductive adhesives. Specifically, the first electric structure includes a first electrode, and the second electric structures includes a second electrode, wherein an electrode bonding section constituted by fusion bonding of the metal particles for providing electric conductivity is provided to at least one of the first electrode of the first electric structure, and the second electrode of the second electric structure. The bonded structure includes a middle bonding section constituted by conductive adhesives for providing electric conductivity between the first electrode and the second electrode through the electrode bonding section, as applicable. Here, the fusion bonding of the metal particles takes place at a temperature lower than the thermal hardening (thermosetting) temperature of the conductive adhesives. Further, the conductive adhesives contain conductive filler pieces having a particle size at which fusion bonding does not take place below the thermosetting temperature of the conductive adhesives.

In the process for thermally hardening the conductive adhesive, the metal particles are fused at a temperature lower than the thermosetting temperature of the conductive adhesives. Through this metal particle fusing process, the electrode to which the electrode bonding section is provided, and conductive filler pieces that touch such electrode are fusion bonded, providing "hard bonding" between the conductive adhesives and the electrode. As for the middle bonding section, the conductive adhesives are thermally hardened, and the conductive filler pieces touch each other, providing electric conductivity; however, the conductive filler pieces are not fusion bonded. In this manner, the middle bonding section provides "soft bonding".

According to an aspect of the present invention, the metal particles of the electrode bonding section are coated by one of a surfactant and an oxidization film for controlling the fusion bond phenomenon.

By adjusting properties of such coating, the temperature at which the fusion bond is to take place can be controlled.

According to an aspect of the present invention, each of the conductive filler pieces is shaped like a needle, i.e., a long body extending in the directions of one axis, and having a small cross-section.

In this manner, the conductive filler pieces contact each other, resulting in a 3-dimensional mesh structure that provides a stable low resistance even if the composition ratio of the conductive filler pieces is low.

According to an aspect of the present invention, the conductive adhesives of the middle bonding section are made of silicon resin.

In this manner, the superb elastic property of silicon resin is used to improve a stress relief function of the bonded structure.

According to an aspect of the present invention, fusion bonding of the metal particles is used on one of the first electrode and the second electrode, and bonding by the adhesive strength of the conductive adhesives is used on the other.

In this manner, as for the electrode on which the conductive adhesives are used for bonding, boundary exfoliation by applying shearing force is possible. This facilitates repair and re-bonding work, dispensing with a reproduction process of the electrode.

According to an aspect of the present invention, the electrode bonding section includes conductive adhesives that further include metal particles for fusion bonding, which takes place below the thermosetting temperature of the conductive adhesives, and conductive filler pieces each having a particle size at which fusion bonding does not take place below the thermosetting temperature of the conductive adhesives, and adhesives.

In this manner, fusion bonding by the metal particles is carried out between the electrode and the conductive filler pieces, and among the conductive filler pieces; and the adhesive strength at the bonding boundary is improved.

Here, the conductive filler pieces of the electrode bonding section can be the needle-shaped conductive fillers.

In this manner, high mobility of the conductive filler pieces in the conductive adhesives (silicon resin) is obtained, and the stress relief function is improved in comparison with conventional filler pieces that are shaped like a flake or a sphere.

Further, the metal particles may be adhered to the surface of the needle-shaped conductive filler pieces of the electrode bonding section, the metal particles being capable of fusion bonding at a temperature lower than the thermosetting temperature of the conductive adhesives.

In this manner, fusion bonding by the metal particles between the electrode and the needle-shaped conductive filler pieces, and fusion bonding by the metal particles among the needle-shaped conductive filler pieces are promoted.

Further, the elastic modulus of the conductive adhesives of the electrode bonding section is set higher than the elastic modulus of the conductive adhesives of the middle bonding section.

In this manner, while the adhesive strength at the bonding boundary of the conductive adhesives is improved, the stress relief function is obtained at the middle bonding section wherein the conductive filler pieces contact each other.

Further, the conductive adhesives of the middle bonding section may contain the needle-shaped conductive filler pieces.

In this manner, the stress relief function of the middle bonding section is improved.

According to an aspect of the present invention, the composition ratio of the conductive filler pieces to the adhesives of the electrode bonding section is set greater than the composition ratio of the conductive filler pieces to the adhesives of the middle bonding section.

In this manner, in the electrode bonding section, fusion bonding by the metal particles between the electrode and the conductive filler pieces, and fusion bonding by the metal particles among the conductive filler pieces are further improved.

According to an aspect of the present invention, the conductive adhesives are bonded to the electrode through a fusion layer of the metal particles.

In this manner, at the bonding boundary of the electrode bonding section, minute unevenness (concavo-convex) is formed by fusion of the metal particles on the electrode surface, and the adhesion strength is raised by the anchoring effect of the adhesives.

According to an aspect of the present invention, at least one of the first electrode and the second electrode is constituted by a vamp on a bare chip.

In this manner, the vamp on the bare chip and the conductive filler pieces in the conductive adhesives are fusion bonded by the metal particles, providing improved bonding strength even if bonding is carried out over a small area.

According to an aspect of the present invention, the needle-shaped conductive filler pieces of the electrode bonding section and the middle bonding section are whiskers, on the surface of which whiskers metal coating is carried out.

In this manner, needle-shaped conductive filler pieces having a small diameter and a high aspect ratio are obtained at low cost. Further, since the diameter is small, a small pitch bonding is attained; and since the aspect ratio is high and a 3-dimensional mesh structure is obtained, the composition ratio of the conductive filler pieces for obtaining predetermined conductivity can be lowered.

An aspect of the present invention provides a manufacturing method for manufacturing the bonded structure as described above, wherein the metal particles are adhered to at least one of the first electrode and the second electrode, and the conductive adhesives are heated for bonding the first and the second electrodes, when fusion bonding by the metal particles and hardening of the conductive adhesives are simultaneously carried out.

According to an aspect of the present invention, the manufacturing method includes a step for providing a colloidal suspension containing the metal particles to such electrode, and volatilizing the suspending medium of the colloidal suspension, thereby the metal particles are adhered to the electrode.

[Effect of the Invention]

Effect of the present invention is summarized as follows.

(1) Since the electrode bonding section is constituted by the metal particles that fuse at a temperature lower than the thermosetting temperature of the adhesives, fusion bonding of the electrode and thermal hardening bonding of the conductive adhesives are simultaneously carried out. Accordingly, no special process for fusion bonding of the electrode is needed, and the low-temperature process prevents damage to the electric structures from occurring, while providing sufficient bonding strength at the electrode bonding section.

Further, since the conductivity of the middle bonding section is obtained by mutual contact of the conductive filler pieces having a particle size at which fusion does not take place below the thermosetting temperature of the adhesives, the middle section is bonded with a satisfactory stress relief property.

(2) According to an aspect of the present invention, since the conductive filler pieces of the middle bonding section are needle-shaped conductive filler pieces, the conductive filler pieces contact each other forming a 3-dimensional mesh structure in the adhesives. Accordingly, a stable low resistance is obtained even if the composition ratio of the conductive filler pieces is low. In this manner, the elastic modulus of the conductive adhesives of the middle bonding section can be lowered, and the stress relief function and bonding reliability over thermal distortion and the like are improved.

(3) According to an aspect of the present invention, since the adhesives of the middle bonding section are made of silicon resin, high elasticity is obtained, providing a satisfactory stress relief property.

(4) According to an aspect of the present invention, one of the first electrode and the second electrode is bonded by fusion bonding, and the other is bonded such that exfoliation at the bonding boundary is possible by applying a shearing force. Accordingly, when repairing the bonded structure, a process for reproducing the electrode is dispensed with.

Further, this bonding provides a satisfactory stress relief property of the conductive adhesive section, i.e., the middle bonding section, reducing the stress at the bonding boundary due to the thermal distortion and the like.

(5) According to an aspect of the present invention, the electrode bonding section is constituted by the conductive adhesives containing the metal particles, the conductive filler pieces, and the adhesives; and bonding between the electrode and the conductive filler pieces, and among the conductive filler pieces are obtained by fusion bonding by the metal particles, improving the adhesive strength at the bonding boundaries.

(6) According to an aspect of the present invention, since the shape of the conductive filler pieces is like a needle, the movable capacity in the resin and the stress relief capability are higher than conductive filler pieces having the shape of a flake and a sphere. For this reason, the bonding reliability over thermal distortion and the like is further improved.

(7) According to an aspect of the present invention, since the needle-shaped conductive filler pieces are coated by the metal particles, and kneaded into the adhesives, fusion bonding by the metal particles between the electrode and the needle-shaped conductive filler pieces, and among the needle-shaped conductive filler pieces is promoted. In this manner, the bonding strength is improved, and the electric resistance is reduced.

(8) According to an aspect of the present invention, since the elastic modulus of the conductive adhesives of the electrode bonding section is set greater than the elastic modulus of the conductive adhesives of the middle bonding section, the adhesive strength at the bonding boundary by the conductive adhesives is improved, and the stress relief function of the middle bonding section, wherein conductivity is obtained by mutual contact of the conductive filler pieces, is improved.

(9) According to an aspect of the present invention, the conductive adhesives of the middle bonding section contain the needle-shaped conductive filler pieces. In this manner, the stress relief function of the middle bonding section, wherein conductivity is obtained by mutual contact of the conductive filler pieces, is improved.

(10) According to an aspect of the present invention, since the composition ratio of the conductive filler pieces of the conductive adhesives of the electrode bonding section is set greater than the composition ratio of the conductive filler in the conductive adhesives of the middle bonding section, fusion bonding by the metal particles between the electrode and the conductive filler pieces, and among the conductive filler pieces at the electrode bonding section provides high adhesion strength, while the high stress relief function is provided by the middle bonding section.

(11) According to an aspect of the present invention, since the electrode is bonded by the conductive adhesives through the fusion layer of the metal particles, minute unevenness (concavo-convex) is formed on the surface of the electrode by fusion of the metal particles at the bonding boundary of the electrode bonding section. In this manner, the anchoring effect of the adhesives is used such that the adhesion strength is raised.

(12) According to an aspect of the present invention, since a vamp on a bare chip and the conductive filler pieces of the conductive adhesives are fusion bonded by the metal particles, even if bonding is carried out over a small area, sufficient bonding strength is obtained, and consequently, a bare chip having an expansion factor greatly different from that of the substrate can be mounted to the substrate.

(13) According to an aspect of the present invention, metal-coated whiskers are used as the needle-shaped conductive filler pieces. In this manner, the needle-shaped conductive filler pieces having a small size and a great aspect ratio are available at low cost. Since the size of the needle-shaped conductive filler pieces is small, small-pitch bonding is available, and the 3-dimensional mesh structure of the metal-coated whiskers allows the composition ratio of the needle-shaped conductive filler pieces to be low for obtaining predetermined conductivity. As a result, the stress relief property and the adhesive strength of the adhesives are improved.

(14) According to an aspect of the present invention, the manufacturing process for manufacturing the bonded structure is simplified, wherein the metal particles are first adhered to the electrode, and then thermal hardening of the conductive adhesives is carried out such that fusion bonding by the metal particles and thermal hardening of the conductive adhesives are simultaneously performed.

Further, according to an aspect of the present invention, the metal particles are adhered to the electrode by providing a colloidal suspension containing the metal particles to the electrode, and volatilizing the suspending medium of the colloidal suspension.

DESCRIPTION OF THE PREFERRED EMBODIMENTS

Figure 1A:
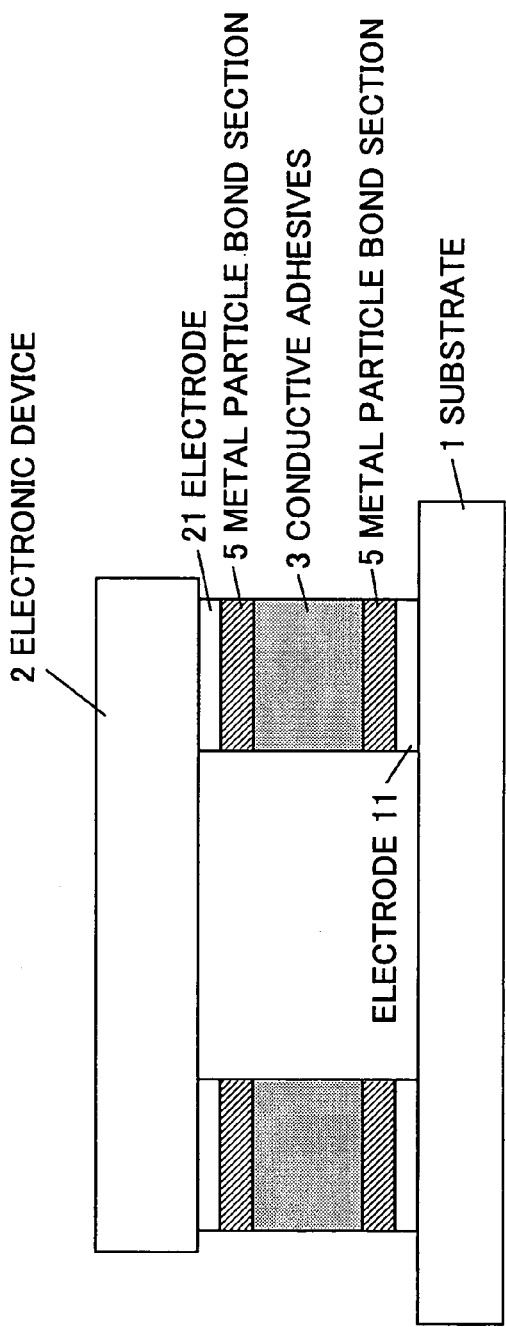
FIG. 1 is a cross-sectional schematic drawing showing a first embodiment of the present invention.

In the following, embodiments of the present invention are described with reference to the accompanying drawings.

According to the present invention, a first electric structure having a first electrode and a second electric structure having a second electrode are bonded to make a bonded structure by a middle bonding section constituted by conductive adhesives that provide "soft bonding", wherein bonding of the middle bonding section to at least one of the first electrode and the second electrode is carried out by "hard bonding" that is fusion bonding by metal particles. Further, the metal particles are ones that can be fused at a temperature lower than a thermosetting temperature of the conductive adhesives, and the conductive adhesives serving as the middle bonding section are ones that contain conductive filler pieces having a particle size at which fusion does not take place at a temperature lower than the thermosetting temperature of the conductive adhesives. Accordingly, when a heating process is carried out, the conductive adhesives are thermally hardened and fusion bonding between the electrode and the metal particles in the conductive adhesives takes place simultaneously.

Before explaining the embodiments of the present invention in detail, the fusion bond phenomenon of the metal particles is explained, since the phenomenon is directly related to the present invention.

Generally, surface energy of a particle rapidly increases when the diameter of the particle becomes less than 100 nm, particularly about 10 nm, and condensation including the fusion bond phenomenon takes place at a temperature lower than the melting point of the metal. For example, although the melting point of Ag is 961° C., Ag particles having a diameter of several nm are fused at a normal temperature. There are two kinds of structures of the metal particles that can be used for fusion bonding.

(1) The first of the two kinds is metal particles, the surfaces of which are covered by a surfactant. Such metal particles are distributed in a suspension medium, and a colloidal suspension is obtained. The metal particles are fused at a fusion temperature higher than a certain temperature. The surfactant cover is provided in order to control the fusion temperature, otherwise the metal particles are undesirably fused at the certain temperature, e.g., a normal temperature. Thus, the fusion temperature can be controlled (raised or lowered) by selecting the surfactant. As a material using this phenomenon, a conductive paste (metal nano paste) containing metal particles has been developed for circuit pattern formation. The metal particles of the conductive paste start fusing at about 150° C. As for the metal, gold, silver, platinum, copper, nickel, etc., can be used; however, in order to obtain stable fusion bonding, noble metals, such as gold, silver, and platinum are desired, because an oxidized film on the surface of the metal disturbs the fusion bond phenomenon.

(2) The second of the kinds is silver oxide, the reduction action of which is used. That is, the silver oxide detaches oxygen, and returns to silver when it is heated at 160° C. or higher. In order to use this phenomenon, particles of silver oxide are distributed in a suspending medium. By heating the suspension containing the silver oxide particles, silver particles are formed by the reduction action, and the formed silver particles are then fused.

According to the present invention, the adhesion strength at an electrode boundary is increased by bonding the conductive filler pieces in the conductive adhesives to the electrode using the low temperature fusion bond phenomenon of the metal particles.

[First Embodiment]

Figure 1B:
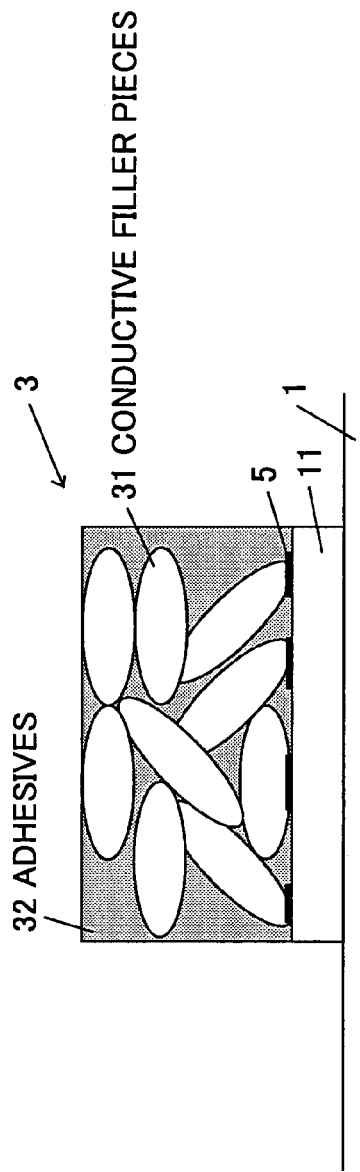

The first of the embodiments of the present invention is explained referring to FIG. 1.

The first embodiment is for bonding an electrode 11 of a substrate 1 (first electric structure) and an electrode 21 of an electronic device 2 (second electric structure) with conductive adhesives 3. The conductive adhesives 3 include conductive filler pieces 31 mixed into adhesives 32. Some of the conductive filler pieces 31 are bonded to the electrode 11 at a metal particle fusion bond section 5, and the same takes place for the electrode 21. Specifically, when bonding the electronic device 2 to the substrate 1, first, metal particles are adhered to the surface of each of the electrodes 11 and 21, then, the conductive adhesives 3 are applied to at least one of the electrodes 11 and 21, and the electronic device 2 is mounted to the substrate 1. Then, heat at about 150° C. is applied such that the metal particles are fused, and the conductive filler pieces 31 are bonded to each of the electrodes 11 and 21.

According to the first embodiment, the process is carried out at a low temperature of about 150° C. with no special pressurization step for hardening the adhesives 32 of the conductive adhesives 3, and simultaneously fusion bonding the metal particles. In this manner, the low-temperature process bonds the two electric structures, avoiding damage to the electronic device.

Hereinafter, the words "metal particles" mean metal particles that produce a fusion bond phenomenon at a low temperature of about 150° C.

The neighborhood of the bonding boundary is as shown at (b) of FIG. 1. Although this view shows the fusion bonding taking place only at the metal particle fusion bond section 5, i.e., at the boundary of the electrode 11, some of the conductive filler pieces 31 may be fusion bonded by the metal particles. Nevertheless, in order to obtain the stress relief function of the bonding section, the conductive filler pieces 31 generally provide conductivity by contacting each other (i.e., not by fusion bonding). Further, it is acceptable that fusion bonding of the metal particles on the electrode surface takes place not only at sections where the conductive fillers make contact, but also on the whole surface of the electrode 11.

[Second Embodiment]

Figure 2:
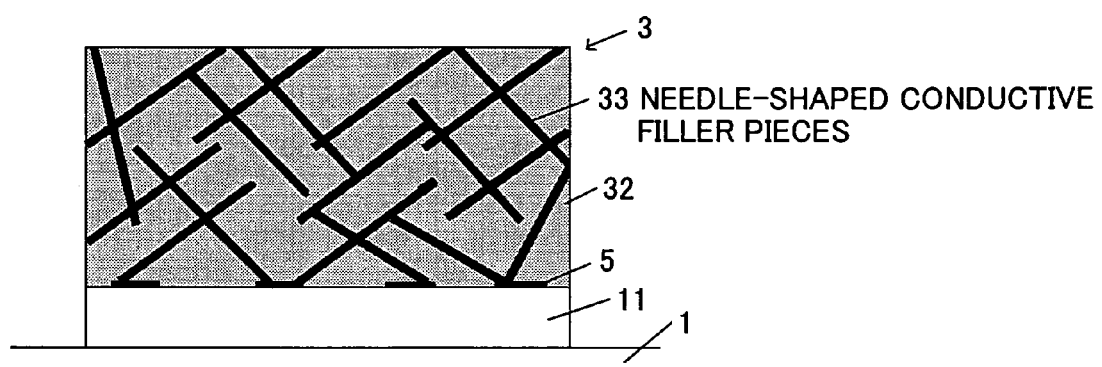
FIG. 2 is a cross-sectional schematic drawing showing the area nearby a bonding boundary according to a second embodiment of the present invention.

The second of the embodiments of the present invention is explained referring to FIG. 2.

The second embodiment is characterized by the conductive adhesives 3 containing needle-shaped conductive filler pieces 33. Each of the needle-shaped conductive filler pieces 33 extends in the directions of one axis. In addition, the conductive adhesives 3 do not have to exclusively contain the needle-shaped conductive filler pieces 33, but may contain conductive filler pieces having a shape other than the needle-formed conductive filler pieces 33.

Since the needle-shaped conductive filler pieces 33 contact each other in the adhesives 32, forming a 3-dimensional mesh structure, a low resistance is stably available, even if the composition ratio (density) of the needle-shaped conductive filler pieces 33 is low. Accordingly, the elastic modulus of the conductive adhesives 32 containing the needle-shaped conductive filler pieces 33 is reduced, and the stress relief function and bonding reliability over thermal distortion are raised.

Here, silicon resin serves as the adhesives 32 of the conductive adhesives 3, the silicon resin providing an excellent elastic property. Conventionally, problems are in that the density of conductive filler pieces has to be raised in order to obtain a low resistance, and that mutual contact among such conductive filler pieces is not stable when being deformed by an external force, resulting in a significant change in the resistance. To solve the problem, the present invention provides the needle-shaped conductive filler pieces 33 kneaded in the silicon resin. As a result, low resistance is stably available even when the density of the filler pieces is low, and the resistance change when being deformed is also reduced. By constituting the conductive adhesives 3 in this way, the stress relief function is remarkably enhanced, fully enjoying the advantage of the elastic property of the silicon resin. That is, the low resistance and the low elastic modulus are simultaneously obtained. Accordingly, bonding of materials that have great expansion factor differences is made possible.

EXAMPLE

Next, an example of the second embodiment is explained.

Conductive adhesives were made as an experiment, using TSE 3250 as the silicon resin, and needle-shaped conductive filler pieces of Ag coated ceramic whisker as the conductive filler pieces, wherein the density of the needle-shaped conductive filler pieces was set at 15% to 25% by volume. The ceramic whisker used here had a diameter of about 0.5 μm, and an average length was 10 to 20 μm. As a result, the elastic modulus of 0.4 to 1.0 MPa was obtained, which compared with 19.6 MPa of conventional silicon resin system conductive adhesives, for example, DA 6523 (made by Dow Corning Toray Silicon Co., Ltd.) In this case, the experimental conductive adhesives also excelled in the elastic deformation characteristic, and the stress relief capacity of the bonding section was remarkably high.

[Third Embodiment]

Figure 3:
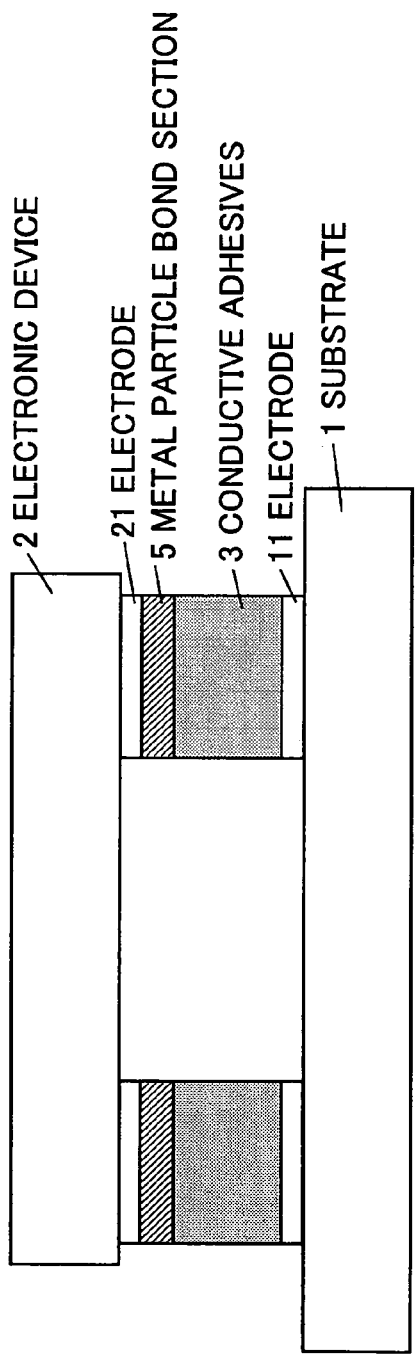
FIG. 3 is a cross-sectional schematic drawing showing a third embodiment of the present invention.

The third embodiment of the present invention is explained referring to FIG. 3.

Here, the electronic device 2 and the substrate 1 are also bonded by the conductive adhesives 3, and the conductive filler pieces are mainly constituted by the needle-shaped conductive filler pieces kneaded in the silicon resin. The third embodiment is characterized in that the bonding to the electrode 21 (of the electronic device 2) uses fusion bonding of the metal particles, and the bonding to the electrode 11 (of the substrate 1) uses the adhesive strength of the conductive adhesives 3.

The conductive adhesives 3 that include the needle-shaped conductive filler pieces 33 kneaded in the silicon resin stably provide a low resistance even if the density of the needle-shaped conductive filler pieces 33 is low, and have mechanical properties almost the same as the silicon resin properties, such as the same elastic property. Further, as for the mechanical strength, the conductive adhesives 3 show the same property wherein the in-material breaking strength of the silicon resin is greater than the adhesion strength. Accordingly, if a compulsory shearing force is applied, exfoliation takes place at the electrode boundary (bonding face).

That is, by carrying out fusion bonding by the metal particles only on one electrode (such as 21), and carrying out bonding that is capable of boundary exfoliation on the other electrode (such as 11), exfoliation by applying the shearing force can take place at a desired electrode boundary. In this manner, when repairing is required, a reproduction process of the electrode is dispensed with, and re-bonding is easily carried out. In addition, since the conductive adhesives section according to this embodiment provides an excellent stress relief property, stress due to thermal distortion, and the like, at the bonding boundary is reduced, and reliable bonding is obtained.

In contrast, if a shearing force is applied to a bonding section that is constituted by generic conductive adhesives, in-material destruction may be caused, and residual material may remain on the electrode. For this reason, when repairing, the electrode has to be reproduced before re-bonding is carried out.

[Fourth Embodiment]

Figure 4:
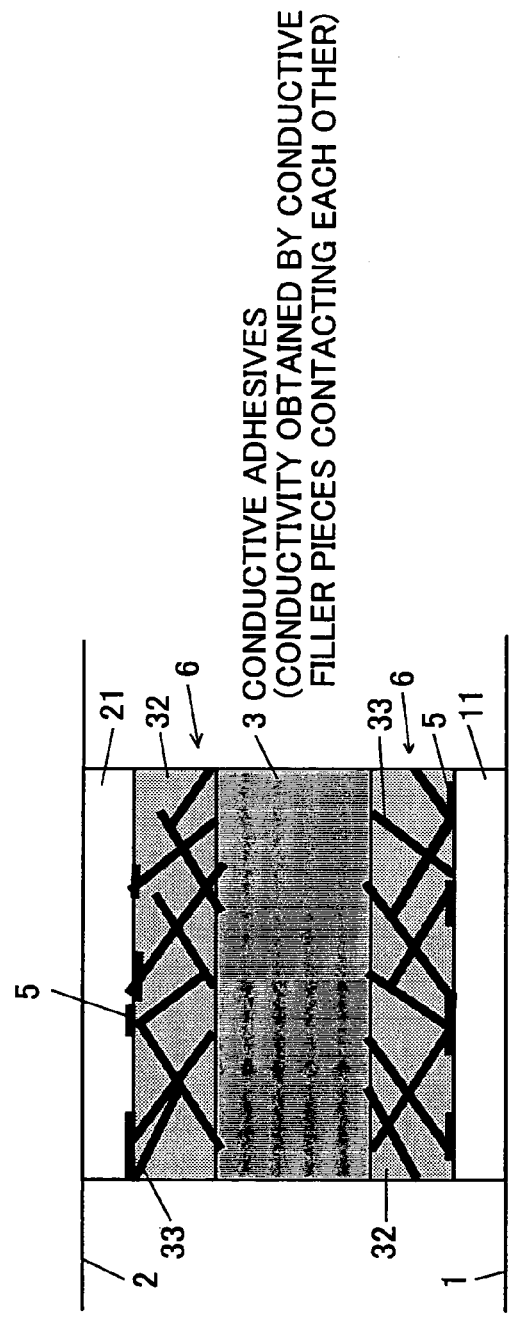
FIG. 4 is a cross-sectional schematic drawing showing fourth and fifth embodiments of the present invention.
Figure 5:
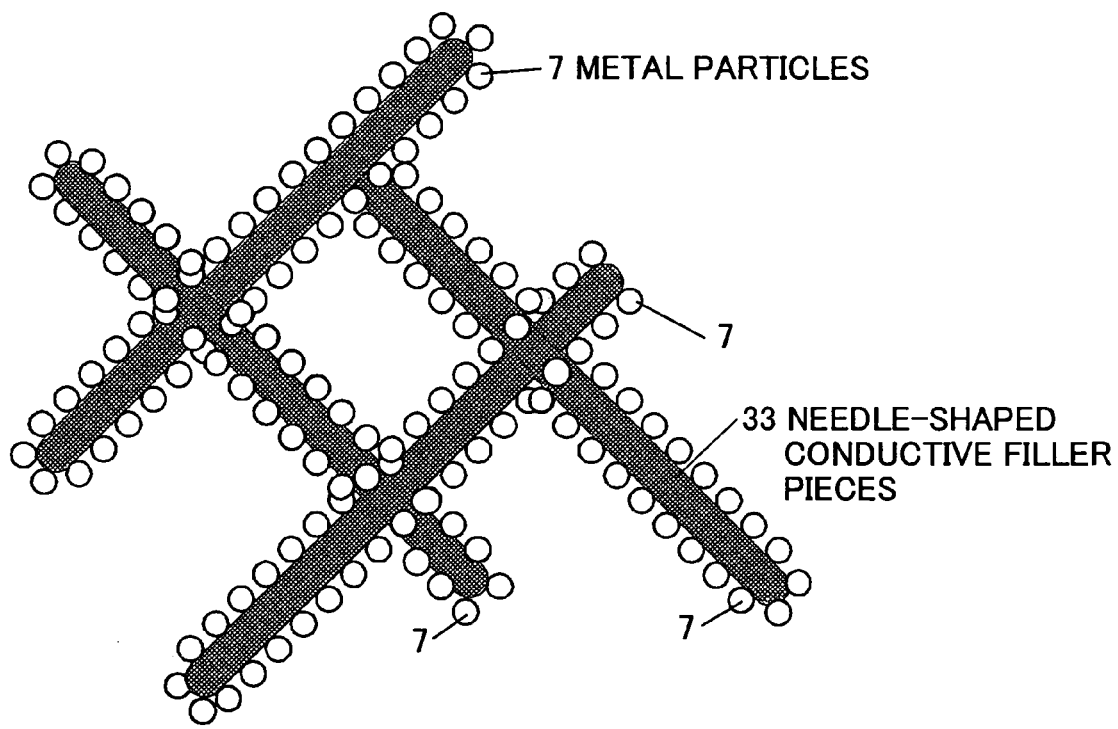
FIG. 5 is a schematic diagram showing needle-shaped conductive filler pieces according to the fourth embodiment of the present invention.

The fourth embodiment of the present invention is explained referring to FIG. 4 and FIG. 5.

According to the fourth embodiment, conductive adhesives 6 are bonded to each of the electrodes 11 and 21, the conductive adhesives 6 containing at least the adhesives 32, the metal particles, and the needle-shaped conductive filler pieces 33, wherein the metal particles provide fusion bonding between the electrode 11 and the needle-shaped conductive filler pieces 33, between the electrode 21 and the needle-shaped conductive filler pieces 33, and among the needle-shaped conductive filler pieces 33. Thereby, the adhesive strength of the bonding boundary is improved. Here, although the needle-shaped conductive filler pieces 33 are also fusion bonded by the metal particles, since the needle-shaped conductive filler pieces 33 serve as the conductive filler pieces, the mobility of the needle-shaped conductive filler pieces 33 in the resin (adhesives) is higher than that of conventional flake-shaped filler pieces and spherical shape filler pieces. Accordingly, the conductive adhesives 6 provide a relatively high stress relief function, high bonding reliability over thermal distortion and the like, and a low resistance as compared with the conventional conductive adhesives.

Further, as shown in FIG. 5, metal particles 7 of the conductive adhesives 6 may be adhered to the surface of the needle-shaped conductive filler pieces 33. Then, the needle-shaped conductive filler pieces with the metal particles 7 adhered are kneaded into the adhesives 32. This arrangement promotes bonding between the electrodes and the needle-shaped conductive filler pieces 33, and among the needle-shaped conductive filler pieces 33, resulting in enhanced bonding strength and lowered resistance.

In order to obtain the needle-shaped conductive filler pieces 33, the surfaces of which are covered by the metal particles 7, a colloidal suspension containing the metal particles 7 and the needle-shaped conductive filler pieces 33 is mixed, and then the suspending medium of the colloidal suspension is volatilized. This process produces the needle-shaped conductive filler pieces 33 with metal particles 7 adhered, which are then kneaded into the adhesives 32 to simply obtain the conductive adhesives 6 containing the needle-shaped conductive filler pieces 33 to which the metal particles 7 are adhered.

EXAMPLE

An example is explained about the conductive adhesives 6 wherein the metal particles 7 are mixed with the needle-shaped conductive filler pieces 33.

Using a planet type (rotation/revolution type) stirrer, a colloidal suspension containing two parts of Ag, measured by volume, and 20 parts (by volume) of Ag-coated needle-shaped conductive filler pieces are agitated, and the suspending medium of the colloidal suspension is volatilized during this process. Then, 78 parts (by volume) of silicon resin TSE 3221 are added, and the mixture is kneaded using a planet type stirrer. The process in this sequence promotes the bonding among the conductive filler pieces, and provides a higher elastic modulus of a hardened matter in comparison with a process wherein the Ag-coated needle-shaped conductive filler pieces and the silicon resin are first kneaded, and then the Ag colloidal suspension is added, provided the composition ratios of the described materials are the same in both cases.

[Fifth Embodiment]

The fifth embodiment of the present invention is explained referring to FIG. 4.

While the present invention offers enhanced adhesion strength by bonding the electrode and the conductive filler pieces, in order to improve the reliability of the bonding section, improvement in not only the adhesion strength but also the stress relief function at the bonding section against thermal distortion is required. Accordingly, in the fifth embodiment, the elastic modulus of the conductive adhesives 6 is made high and the elastic modulus of the conductive adhesives 3 is made low at the middle bonding section, inside of which conductivity is obtained by mutual contact of the conductive filler pieces. In this way, while the adhesion strength of the conductive adhesives at the bonding boundary is raised, the stress relief function of the middle bonding section where conductivity is obtained by mutual contact of the conductive filler pieces is sufficiently obtained.

EXAMPLE

An example of the fifth embodiment is explained.

Bonding was carried out with the composition of the conductive adhesives 6 and the composition of the conductive adhesives 3 being set as follows.

The composition of the conductive adhesives 6 for electrode bonding:

(1) Silicon resin TSE 3221: JIS-A hardness 28 (made by GE Toshiba Silicones) 78% by volume, (2) Ag metal particles: average diameter of the particles 10–20 nm, 2% by volume, and (3) Ag-coated needle-shaped conductive filler pieces: diameter 0.5 μm, and length 10–20 μm, 20% by volume.

The composition of the conductive adhesives 3 for conductive filler contact bonding:

(4) Silicon resin TSE 3250: JIS-A hardness 9 (made by GE Toshiba Silicones) 80% by volume, and (5) Ag-coated needle-shaped conductive filler pieces: diameter 0.5 μm, and length 10–20 μm, 20% by volume.

As a result of applying a shearing force and carrying out a breakdown test on a sample made by the conductive adhesives 6 and the conductive adhesives 3 as described above, the destruction mode was determined to be condensation destruction of the conductive adhesives 3 wherein conductivity is obtained by contact among the conductive filler pieces. Further, the bonding by the conductive adhesives 3 had high elastic-deformation capacity, and proved to provide excellent properties of improved adhesion strength to the electrode and the stress relief function.

The composition ratio of the needle-shaped conductive filler pieces 33 in the conductive adhesives 6 at the electrode bonding section, where bonding takes place between the electrode, such as 11, and the needle-shaped conductive filler pieces 33, was made higher than the composition ratio of the conductive filler pieces in the conductive adhesives 3 of the middle bonding section where the conductivity is obtained by the conductive filler pieces mutually contacting. In this way, fusion bonding by the metal particles between the electrode, such as 11, and the needle-shaped conductive filler pieces 33, and fusion bonding by the metal particles among the needle-shaped conductive filler pieces 33 was enhanced. In this manner, the adhesion strength was raised. Further, the needle-shaped conductive filler pieces that are used in the present invention provided high adhesive strength fully enjoying the adhesive strength of the adhesives, and allowed the composition ratio to be low due to the shape, as compared with conventional conductivity filler pieces that are shaped like flakes and spheres.

[Sixth Embodiment]

Figure 6:
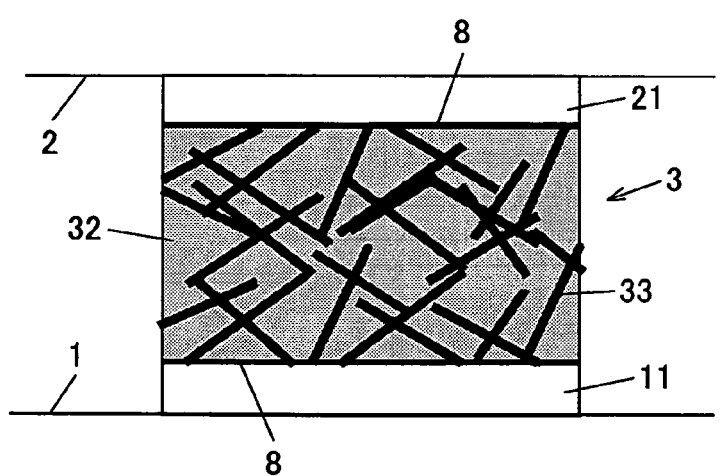
FIG. 6 is a cross-sectional schematic drawing showing the area nearby a bonding boundary according to a sixth embodiment of the present invention.

The sixth embodiment of the present invention is explained referring to FIG. 6.

According to the sixth embodiment, the electrode 11 of the substrate 1 (first electric structure) and the electrode 21 of the electronic device 2 (second electric structure) are bonded by the conductive adhesives 3 through respective fusion layers 8 consisting of the metal particles prepared on each of the electrode 11 and the electrode 21. The metal particles on the electrodes 11 and 21 are fusion bonded over the whole surface of each of the electrodes 11 and 21, i.e., whether or not the needle-shaped conductive filler pieces 33 of the conductive adhesives 3 touch the metal particles. In this way, the electrode 11, the needle-shaped conductive filler pieces 33, and the electrode 21 are fusion bonded by the metal particles.

Fusion bonding by the metal particles of the electrodes 11 and 21, and the needle-shaped conductive filler pieces 33 increases the bonding strength. In addition, since fusion bonding also takes place where the electrodes 11 and 21 do not touch the needle-shaped conductive filler pieces 33, minute unevenness and minute holes are formed on the electrodes. The unevenness and holes provide for the anchoring effect of the adhesives 32, further enhancing the bonding strength.

A method of forming the fusion layer 8 of metal particles on the electrodes 11 and 21 is described. First, a colloidal suspension containing the metal particles is provided to the electrodes 11 and 21, and then the suspending medium of the colloidal suspension is volatilized. Then, the fusion layers 8 of the metal particles are obtained on the electrodes 11 and 21. At this state, an electric structure such as an electronic device is mounted with conductive adhesives applied. Then, by performing fusion bonding of the metal particles and hardening of the conductive adhesives simultaneously, bonding is completed. The simple process as described above produces the bonded structure.

[Seventh Embodiment]

Figure 7:
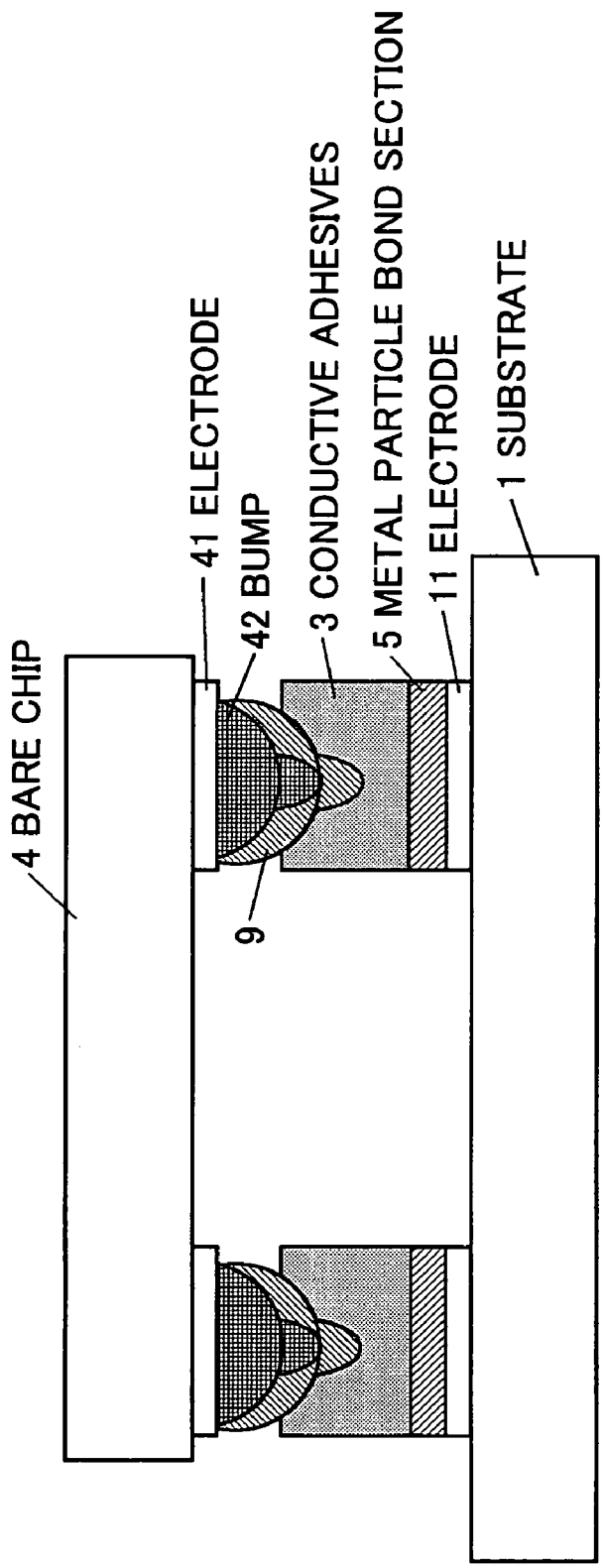
FIG. 7 is a cross-sectional schematic drawing showing a seventh embodiment of the present invention.

The seventh embodiment of the present invention is explained referring to FIG. 7.

According to the seventh embodiment, a vamp 42 is formed on an electrode 41 of a bare chip 4, and the vamp 42 and conductive filler pieces contained in the conductive adhesives 3 are fusion bonded by metal particles. A bonding section 9 where the vamp 42 is bonded consists of one of a body of metal particles, a mixture of needle-shaped conductive filler pieces and the metal particles, and a mixture of the metal particles, the needle-shaped conductive filler pieces and adhesives.

Further, although it is desirable that the conductive adhesives 3 contain the needle-shaped conductive filler pieces in the middle bonding section wherein conductivity is obtained by mutual contact of the conductive filler pieces for enhanced stress relief, the conductive adhesives 3 may contain flake-shaped or spherical conductive filler pieces. Further, as a variation, the fusion bonding by the metal particles may be provided only in one of the bonding section 9 and the metal particle fusion bond section 5. In this case, it is desirable that fusion bonding be provided to the bonding section 9 of the vamp 42 of the bare chip 4.

EXAMPLE

An example of the seventh embodiment of the present invention is explained.

A CCD linear sensor was prepared according to the seventh embodiment, the CCD linear sensor being for manuscript reading, and being constituted by a long chip that included a long CCD bare chip mounted on a substrate of a white sheet glass.

The dimensions of the long CCD chip were 75×1.3 mm. A vamp was formed on electrodes of the CCD bare chip, and conductive adhesives constituted by Ag particles, Ag-coated needle-shaped conductive filler pieces, and silicon resin that were kneaded were provided to the vamp by an imprint method. To the substrate, conductive adhesives, in which Ag-coated needle-shaped conductive filler pieces and silicon resin were kneaded, were provided by screen stenciling. Then, the CCD bare chip was mounted on the substrate, and bonding was carried out through a thermal hardening process to obtain the bonded structure.

Then, the bonded structure, without being packaged, was subjected to a heat cycle test, wherein the lowest cycle temperature was set to −25° C., and the highest cycle temperature was set to 100° C.; and the number of temperature cycles was 1000. After the heat cycle test, the bonded structure proved to provide normal operations. Accordingly, it was determined that the thermal stress, due to great thermal distortion resulting from the linear expansion difference between the bare chip made from Si and the substrate, was satisfactorily relieved by the bonding section, and that the bonding strength at the bonding boundary was satisfactory.

[Eighth Embodiment]

The eighth embodiment of the present invention is explained.

According to the eighth embodiment, as the needle-shaped filler pieces 33 (see FIG. 2, FIG. 4, FIG. 5, etc.), metal-coated whiskers are used. By using such whiskers, the needle-shaped conductive filler pieces having a great aspect ratio and a small diameter are obtained at low cost. As a method for producing the metal-coated whiskers, non-electrolyzed plating and the like can be used.

Since the needle-shaped conductive filler pieces 33 frequently contact each other due to the small diameter and the high aspect ratio, a 3-dimensional mesh structure is obtained, providing satisfactory conductivity, and allowing small pitch bonding. Further, for this reason, the composition ratio of the conductive filler pieces to the adhesives for obtaining predetermined conductivity can be lowered. As described above, conductive adhesives that are capable of improving the stress relief property and the bonding strength are realized.

Further, the present invention is not limited to these embodiments, but various variations and modifications may be made without departing from the scope of the present invention.

The present application is based on Japanese Priority Application No. 2003-326877 filed on Sep. 18, 2003, with the Japanese Patent Office, the entire contents of which are hereby incorporated by reference.

What is claimed is:

1. A bonded structure having electric structures bonded by a conductive adhesive, comprising:
   a first electric structure, including a first electrode;
   a second electric structure, including a second electrode;
   an electrode bonding section configured to provide electric conductivity by fusion bonding of metal particles to at least one of said first and second electrodes;
   a middle bonding section configured to provide electric conductivity between said first and second electrodes by conductive adhesive;
   wherein:
   said metal particles fuse at a temperature below a thermosetting temperature of said conductive adhesive;
   said conductive adhesive contains conductive filler pieces that do not fuse at a temperature below said thermosetting temperature of said conductive adhesive; and
   a portion of said metal particles are fused to one of the first and second electrodes provided with electric conductivity by the electrode bonding section and to the conductive filler pieces within the conductive adhesives, so that the middle bonding section is bonded to said one of the first and second electrodes provided with the electric conductivity by the electrode bonding section.

2. The bonded structure as claimed in claim 1, wherein said metal particles are coated with one of a surfactant and an oxidization film for controlling the fusion bonding.

3. The bonded structure as claimed in claim 1, wherein each of said conductive filler pieces is shaped like a needle.

4. The bonded structure as claimed in claim 3, wherein said needle-shaped conductive filler pieces of the electrode bonding section and the conductive filler pieces of the needle form of the middle bonding section comprise metal coated whiskers.

5. The bonded structure as claimed in claim 1, wherein said conductive adhesive are made of silicon resin.

6. The bonded structure as claimed in claim 1, wherein bonding to one of the first electrode and the second electrode uses the fusion bonding of the metal particles, and bonding to the other electrode is carried out by the conductive adhesive.

7. The bonded structure as claimed in claim 1, wherein said electrode bonding section comprises:
   the metal particles;
   the conductive filler pieces; and
   the conductive adhesive.

8. The bonded structure as claimed in claim 7, wherein each of said conductive filler pieces is shaped like a needle.

9. The bonded structure as claimed in claim 7, wherein each of said conductive filler pieces is shaped like a needle, and the metal particles are attached to each conductive filler piece, wherein the fusion bonding of said metal particles takes place below said thermosetting temperature of said conductive adhesive.

10. The bonded structure as claimed in claim 7, wherein an elastic modulus of said conductive adhesives of said electrode bonding section is set higher than the elastic modulus of the conductive adhesive of said middle bonding section.

11. The bonded structure as claimed in claim 7, wherein said conductive adhesive of said middle bonding section contain said conductive filler pieces, each of said conductive filler pieces being shaped like a needle.

12. The bonded structure as claimed in claim 7, wherein a composition ratio of the conductive filler pieces to the adhesives of the electrode bonding section is set greater than the composition ratio of the conductive filler pieces to the adhesives of the middle bonding section.

13. The bonded structure as claimed in claim 1, wherein said electrode bonding section is bonded by the conductive adhesive through a fusion layer of the metal particles.

14. The bonded structure as claimed in claim 1, wherein at least one of said first electrode and said second electrode is constituted by a vamp on a bare chip.

15. A manufacturing method of the bonded structure as claimed in claim 1, comprising:
  adhering said metal particles to at least one of said first electrode and said second electrode; and
  bonding said first electrode and said second electrode by the conductive adhesive by a heating process, which heating process performs fusion bonding of said metal particles and hardening of said conductive adhesive simultaneously.

16. The manufacturing method of the bonded structure as claimed in claim 15, wherein said metal particles are adhered to said electrode by supplying a colloidal suspension containing the metal particles to the electrode, and volatilizing the suspending medium of the colloidal suspension.

17. The bonded structure as claimed in claim 1, wherein the thermosetting temperature of the conductive adhesive is approximately 150° C.

18. The bonded structure as claimed in claim 1, wherein the conductive filler pieces within the conductive adhesives have particle sizes that generate no fusion at a temperature below said thermosetting temperature of the conductive adhesive.

* * * * *